(12) United States Patent
Frye et al.

(10) Patent No.: US 9,854,690 B1
(45) Date of Patent: Dec. 26, 2017

(54) 3U "T" SHAPED CHASSIS DESIGN WITH RAIL FEATURES (71) Applicant: EMC IP HOLDING COMPANY LLC, Hopkinton, MA (US)

(72) Inventors: Gordon A. Frye, Westborough, MA (US); Ralph C. Frangioso, Jr., East Falmouth, MA (US); Robert P. Wierzbicki, Worcester, MA (US); John Blondin, Douglas, MA (US); Keith C. Johnson, Medway, MA (US)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 0 days.

(21) Appl. No.: 14/664,560

(22) Filed: Mar. 20, 2015

(51) Int. Cl.
*G06F 1/16* (2006.01)
*H05K 5/00* (2006.01)
*H05K 7/18* (2006.01)
*H05K 7/20* (2006.01)
*H05K 7/14* (2006.01)

(52) U.S. Cl.
CPC .......... *H05K 5/0021* (2013.01); *H05K 7/1487* (2013.01); *H05K 7/183* (2013.01); *H05K 7/20* (2013.01); *H05K 7/20709* (2013.01)

(58) Field of Classification Search
CPC ........................................................ G06F 1/16
USPC ........................................ 361/679.21–679.33
See application file for complete search history.

(56) References Cited

U.S. PATENT DOCUMENTS 6,741,463 B1 * 5/2004 Akhtar .................. G06F 1/1632
312/223.1

* cited by examiner

*Primary Examiner* — Jerry Wu
(74) *Attorney, Agent, or Firm* — Day Pitney LLP (57) ABSTRACT

A rack unit for providing a server to be mounted within a storage rack is provided. The rack unit includes a set of low-profile drawer slides configured for mounting the rack unit within the storage rack, the set of low-profile drawer slides configured for mounting upon rails; wherein, the chassis includes at least one wide section for housing computer components. A server and a storage rack are described.

17 Claims, 9 Drawing Sheets

3U "T" SHAPED CHASSIS DESIGN WITH RAIL FEATURES

BACKGROUND OF THE INVENTION

1. Field of the Invention

The invention disclosed herein relates to storage racks for computing equipment, and in particular, to improved designs for increasing available space within a storage rack.

2. Description of the Related Art

As the demand for computing equipment has grown, so has the need for efficient packaging of the equipment. Generally, high capacity computing systems maintained in a variety of servers that are stored within storage racks. Use of rack units stored within storage racks has provided users with a great deal of flexibility in configuring and maintaining components. Typical storage racks permit users to load configurations of components into a given chassis for a rack unit, and in turn load that chassis into a respective portion of the storage rack. As the storage racks and chassis for the rack units are relatively simple, little thought beyond standardization of components has been given to improving designs. However, with the increasing cost of data center floor space, materials, storage racks and rack units are increasingly expensive. With the increasing demand for computing power, it is sometimes difficult to commission new equipment at a rate that keeps up with the need of users.

What are needed are methods and apparatus that improve the capacity of existing storage rack for implementing computing equipment. Preferably, the methods and apparatus do not require retrofit of existing equipment and are easy to implement.

SUMMARY OF THE INVENTION

In one embodiment, a rack unit for providing a server to be mounted within a storage rack is provided. The rack unit includes a set of low-profile drawer slides configured for mounting the rack unit within the storage rack, the set of low-profile drawer slides configured for mounting upon rails; wherein, the chassis includes at least one wide section for housing computer components.

The set of low-profile drawer slides may be mounted upon the chassis and the rails may be mounted within the storage rack, whereas in some embodiments the set of low-profile drawer slides may be mounted upon the chassis and the rails may be mounted within the storage rack. The rack unit may exhibit dimensions for a multiple of U. The rack unit includes dimensions for one of a 1U, 2U, 3U, 4U, 5U, 6U and 7U rack unit. The storage rack may be one of 19 inches wide and 23 inches wide. The storage rack may be compliant with at least one of Electronic Industries Alliance standard EIA-310-D, "Cabinets, Racks, Panels, and Associated Equipment"; Consumer Electronics Association CEA-310-E "Design Requirements for Cabinets, Panels, Racks and Subracks"; and International Electrotechnical Commission, standard IEC 60297 "Mechanical structures for electronic equipment—Dimensions of mechanical structures of the 482.6 mm (19 inch) series." The set of low-profile drawer slides may include at least one of a regular-extension drawer slide, a full-extension drawer slide, an over-travel drawer slide, and a telescoping drawer slide. The chassis may include one of a T-shaped cross-section, and I-shaped cross-section and an inverted T-shaped cross-section. The drawer slide may include at least one of a ball bearing, a roller bearing, a soft closing mechanism and an easy close device. The at least one wide section may be configured for retaining four 3.5 inch hard drives in a side-by-side configuration.

In another embodiment, a server is provided. The server includes a plurality of computer components configured within the chassis of a rack unit, the rack unit configured for being mounted to a storage rack and including a set of low-profile drawer slides configured for mounting the rack unit within the storage rack, the set of low-profile drawer slides configured for mounting upon rails; wherein, the chassis includes at least one wide section for housing the computer components.

The computer components may include at least one of a processor, memory, storage, a power supply, cooling, interface equipment, a switch, a bridge and a node. The rack unit may exhibit dimensions for one of a 1U, 2U, 3U, 4U, 5U, 6U and 7U rack unit. The at least one wide section may be configured for retaining four 3.5 inch hard drives in a side-by-side configuration. The at least one wide section may be configured for retaining four (4) 3.5 inch hard drives in a side-by-side configuration.

In another embodiment, the storage rack for computer equipment is provided. The storage rack includes: at least one server disposed therein, the server including a plurality of computer components configured within the chassis of a rack unit, the rack unit configured for being mounted to the storage rack and including a set of low-profile drawer slides configured for mounting the rack unit within the storage rack, the set of low-profile drawer slides configured for mounting upon rails; wherein, the chassis includes at least one wide section for housing the computer components.

The storage rack may further include at least one of a power supply and a cooling unit. The storage rack may be compliant with at least one of Electronic Industries Alliance standard EIA-310-D, "Cabinets, Racks, Panels, and Associated Equipment"; Consumer Electronics Association CEA-310-E "Design Requirements for Cabinets, Panels, Racks and Subracks"; and International Electrotechnical Commission, standard IEC 60297 "Mechanical structures for electronic equipment—Dimensions of mechanical structures of the 482.6 mm (19 inch) series." The storage rack may be one of 19 inches wide and 23 inches wide.

BRIEF DESCRIPTION OF THE DRAWINGS

The features and advantages of the invention are apparent from the following description taken in conjunction with the accompanying drawings in which.

DETAILED DESCRIPTION OF THE INVENTION

Disclosed herein are embodiments of computer rack units for mounting within a storage rack. The computer rack units disclosed herein provide increased space (that is, volume) within the chassis it houses the various computing components. Accordingly, the computer rack units disclosed herein provide for increased capacity of computing components within an existing (that is, prior art) storage cabinet. More specifically, the increased space permits use of four drives across for at least two or three drives deep by use of a side mounting/ejection mechanism. This permits individual drives to be hot swappable and without requiring a disk tray cable management mechanism.

Advantageously, the computer rack units disclosed herein may be implemented without any additional requirements or training of personnel.

In order to provide some context for the invention disclosed herein, some introductory material is provided.

Figure 1:
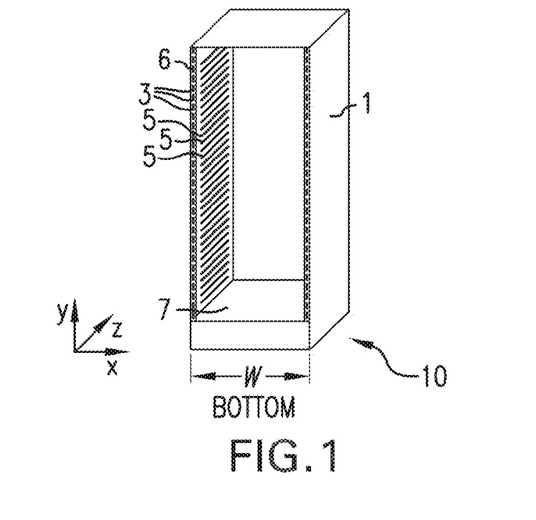
FIG. 1 is an isometric diagram of a storage rack for maintaining a plurality of computer rack unit.

Referring now to FIG. 1, there is shown an exemplary storage rack 10. The storage rack 10 generally includes a housing 1 that provides an enclosure for a plurality of computer rack units. Generally, the storage rack 10 includes a base 7. The base 7 may include various components such as a power supply, cooling units (such as fans) and other such devices. Equipment contained within the base 7 supports operation of the plurality of rack units. The housing 1 includes a left side and a right side. Disposed on an inner surface of each of the left side and the right side are a plurality of rails 5. Each of the rails 5 provides for receiving a complimentary drawer slide that is mounted onto each of the various rack units. Accordingly, each of the rack units may be slid into or out of the housing 1. Generally, the storage rack 10 includes a post 6 disposed on each of a left side and a right side of the housing 1. Disposed within each post 6 is a plurality of holes 3. In some embodiments, the holes 3 are threaded. The holes 3 have a distribution along the length of the post 6 that correlates to fasteners of respective rack units. (See FIG. 2).

As discussed throughout herein, terms of orientation are not limiting. However, for purposes of convention, it may be considered that the various components exhibit dimensional characteristics consistent with the orientations described for the storage rack 10. That is, as shown in FIG. 1, the storage rack 10 has a width, W. The width of each rack unit that is stored within the storage rack 10 is along the same axis (shown as the X-axis). Similarly, the height of each rack unit should be considered in respect to the Y-axis of the storage rack 10, and the depth of each rack unit should be considered in respect to the Z-axis of the storage rack 10.

In some embodiments, distribution of the holes 3 is provided according to industry standards. Accordingly, a variety of rack units may be used within the storage rack 10. In order to provide for standardization, common dimensions for the storage rack 10 are used. In common embodiments, the storage rack 10 is either 19 inches wide or 23 inches wide. Generally, a 23-inch storage rack is used for housing telephone (primarily), computer, audio and other equipment. The 23 inch storage rack is less common than the 19-inch storage rack.

Spacing of the holes 3 within the plurality of holes 3 is either on 1-inch (25 mm) (Western Electric standard), 0.625 inches (or 15.9 millimeters spacing), used for 19-inch (480 mm) racks. Another name for this type of rack is "ETSI rack," which is described in standards promulgated by the European Telecoms Standards Institute.

Other standards for 19 inch wide embodiments of the storage rack 10 include: Electronic Industries Alliance EIA-310-D, "Cabinets, Racks, Panels, and Associated Equipment," dated September 1992. (Latest Standard Now REV E 1996); Consumer Electronics Association CEA-310-E "Design Requirements for Cabinets, Panels, Racks and Subracks," dated Dec. 14, 2005; and multiple standards from the International Electrotechnical Commission (IEC). Multiple documents from the IEC are available in French and English versions. Overall, one governing standard from the IEC is standard IEC 60297 "Mechanical structures for electronic equipment—Dimensions of mechanical structures of the 482.6 mm (19 inch) series." IEC 60297 is available at least as IEC 60297-1 replaced by IEC 60297-3-100; IEC 60297-2; replaced by IEC 60297-3-100; IEC 60297-3-100 Part 3-100: Basic dimensions of front panels, subracks, chassis, racks and cabinets; IEC 60297-3-101 Part 3-101: Subracks and associated plug-in units; IEC 60297-3-102 Part 3-102: Injector/extractor handle; IEC 60297-3-103 Part 3-103: Keying and alignment pin; IEC 60297-3-104 Part 3-104: Connector dependent interface dimensions of subracks and plug-in units; IEC 60297-3-105 Part 3-105: Dimensions and design aspects for 1U chassis; IEC 60297-4 Replaced by IEC 60297-3-102; and, IEC 60297-5 multiple documents, -100, 101, 102, . . . 107, replaced by IEC 60297-3-101.

Generally, embodiments of the rack unit or the storage rack 10 that are substantially in conformity with any industry-standard, such as one of the foregoing standards, may be considered as "compliant" with the respective standard.

With regards to a rack unit, the symbol "U" or "RU" is used to provide a unit of measure. The unit of measure describes the height of the rack unit that is designed to mount in a 19-inches wide storage rack 10 or a 23-inches wide storage rack 10. The 19-inch (482.6 mm) or 23-inch (584.2 mm) dimension reflects the width of the equipment mounting-frame in the rack including the frame; the width of the equipment that can be mounted inside the rack is less. One rack unit is 1.75 inches (44.45 mm) high.

The size of a piece of rack-mounted equipment is frequently described as a number in "U." For example, a standard rack unit is often referred to as "1U," with taller rack units being multiples thereof. That is, a rack unit that is two times the height of the 1U rack unit is referred to as a "2U" and so on. Common rack units include rack units that are referred to as 1U, 2U, 3U, 4U, 5U, 6U and 7U rack units.

A typical full size storage rack 10 has a capacity of 42U. Accordingly, a typical full-size storage rack 10 holds just over six feet of equipment. A typical "half-height" storage rack 10 would be between about 18U to 22U, or around three feet high.

A front panel or filler panel in a rack is not an exact multiple of 1.75 inches (44.45 mm). To allow space between adjacent rack-mounted components, a panel is $\frac{1}{32}$ inch (0.031 inch or 0.79 mm) less in height than the full number of rack units would imply. Thus, a 1U front panel would be 1.719 inches (43.66 mm) high. If N is number of rack units, the formula for panel height is H=(1.750N−0.031) inch= (44.45N−0.79) mm.

The height of the electronic modules is also standardized as multiples of 1.752 inches (44.50 mm) or one rack unit or U (less commonly RU). Over time, various standards have come to set the unit of "U" as 44.5 mm (15.9 mm+15.9 mm+12.7 mm), making each "U" officially 1.752 inches.

Figure 2:
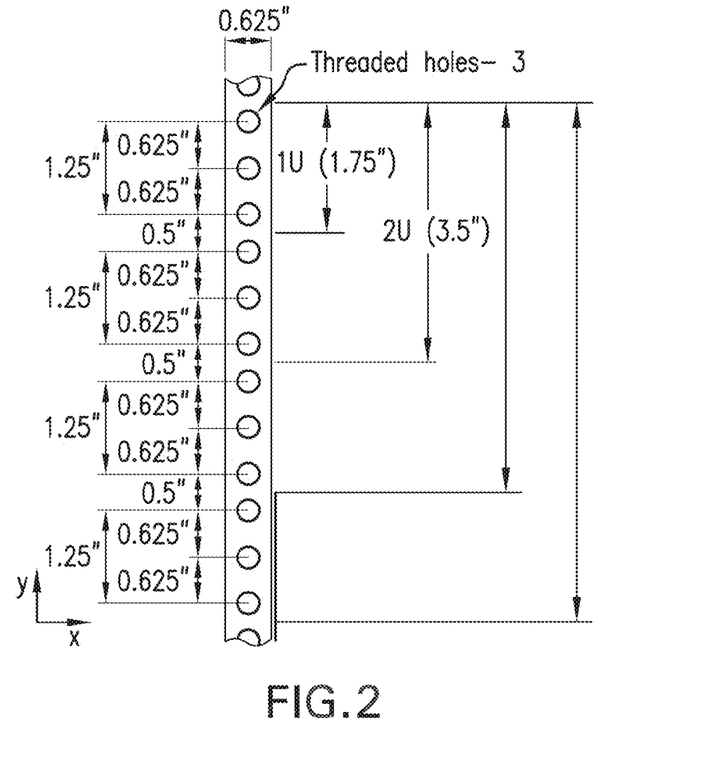
FIG. 2 is an exploded view of a post within the storage rack of FIG. 1.

Note that the mounting-hole distance differs between a 19-inch wide storage rack 10 and a 23-inch wide storage rack 10. The 19-inch wide storage rack 10 uses uneven spacings (as shown in FIG. 2) while the 23-inch wide storage rack 10 uses evenly spaced mounting holes 3. It should be noted that although it is called a 19 inch rack unit, the actual mounting dimensions of a 19 inch rack unit are 18.19" inches (462 mm) wide, center to center.

Figure 3:
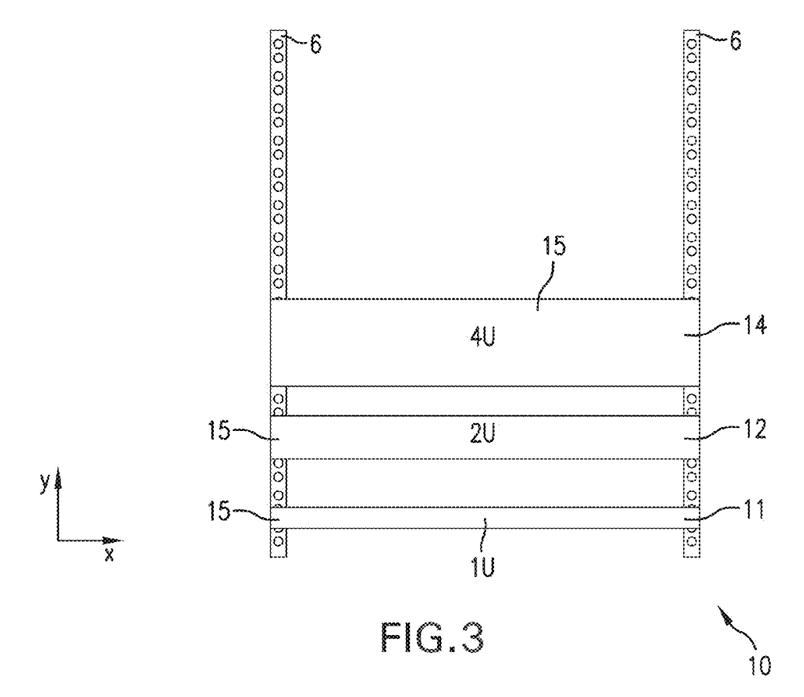
FIG. 3 is a schematic diagram depicting exemplary rack units stored within the storage rack of FIG. 1.

Referring now also to FIG. 3, aspects of an exemplary embodiment of the storage rack 10 are shown. In this example, the storage rack 10 includes three rack units 15 mounted therein. The first rack unit 15 shown is a 1U rack unit 11. The second rack unit 15 shown is a 2U rack unit 12. The third rack unit 15 shown is a 4U rack unit 14.

Figure 4:
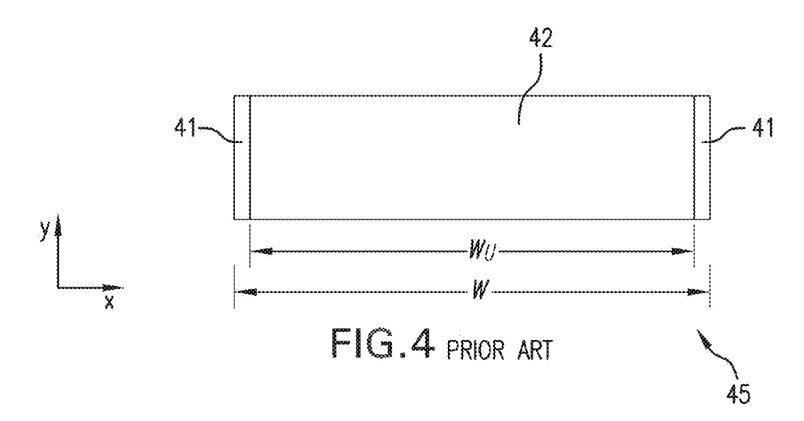
FIG. 4 is a schematic diagram depicting an exemplary prior art rack unit.

Referring now to FIG. 4, aspects of an exemplary prior art rack unit 45 are shown. In the exemplary embodiment, the prior art rack unit 45 includes a chassis having a rectangular cross-section. Disposed on each of a left side and on a right side of the chassis is a drawer slide 41. Accordingly, the prior art rack unit 45 may be characterized as having a width, W, with an interior component space 42 for components that has a usable width, $W_U$. Generally, the component space 42 provides for mounting of computer components such as at least one processor, memory, storage, power supplies, cooling, interface equipment (such as a local area network (LAN) interface), switches, bridges, nodes and other such equipment as may provide for computing functions.

A rack unit that includes a configuration of computer components arranged therein may also be referred to as a "server."

Figure 5A:
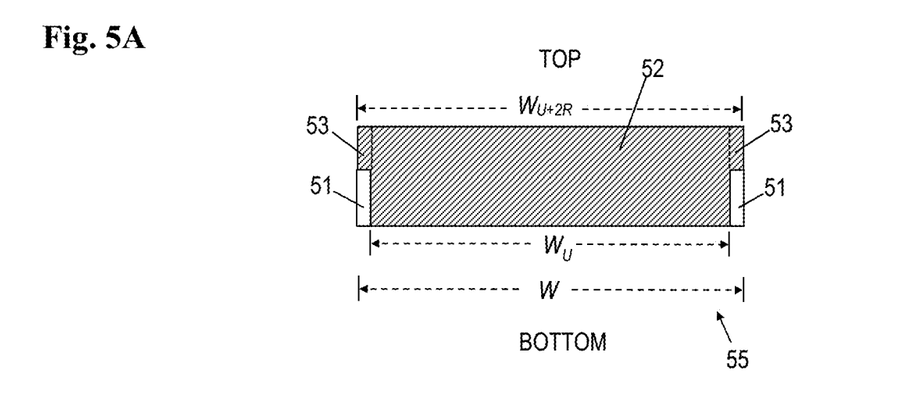
FIGS. 5A and 5B, collectively referred to herein as FIG. 5, are schematic diagrams depicting embodiments of an exemplary rack unit according to the teachings herein.
Figure 5B:
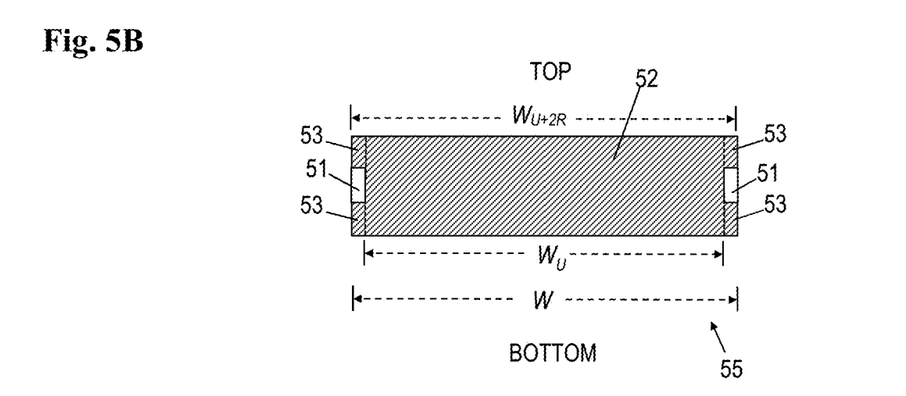

Referring now to FIG. 5, aspects of a novel rack unit 55 are shown. In the exemplary embodiment, shown in FIG. 5A, the rack unit 55 includes a chassis 52 having a T-shaped cross-section, as depicted by the shaded portion of the diagram. Disposed on each of the left side and of the right side of the chassis 52 is a drawer slide 51. Generally, the drawer slide 51 is disposed on a lowermost portion of the respective side of the rack unit 55. In another exemplary embodiment, shown in FIG. 5B, the rack unit 55 includes a chassis 52 having an I-shaped cross-section, as depicted by the shaded portion of the diagram.

Accordingly, by placing each drawer slide 51 in a lowermost portion along the sidewall of the chassis, the chassis may be widened above the drawer slide. Specifically, where the chassis of the rack units 55 includes the drawer slides 51, the rack unit 55 has a usable width, $W_U$. Above the portion of the chassis of the rack units 55 where the drawer slides 51 are disposed, the rack unit 55 has additional space 53. Combining the additional space 53 from each side, the rack unit 55 has a wider usable width, $W_{U+2R}$, where R represents a width of each of the additional spaces 53. The wider portion of the chassis, that which has a width ($W_{U+2R}$), is referred to herein simply as a "wide section" of the rack unit 55.

Figure 6A:
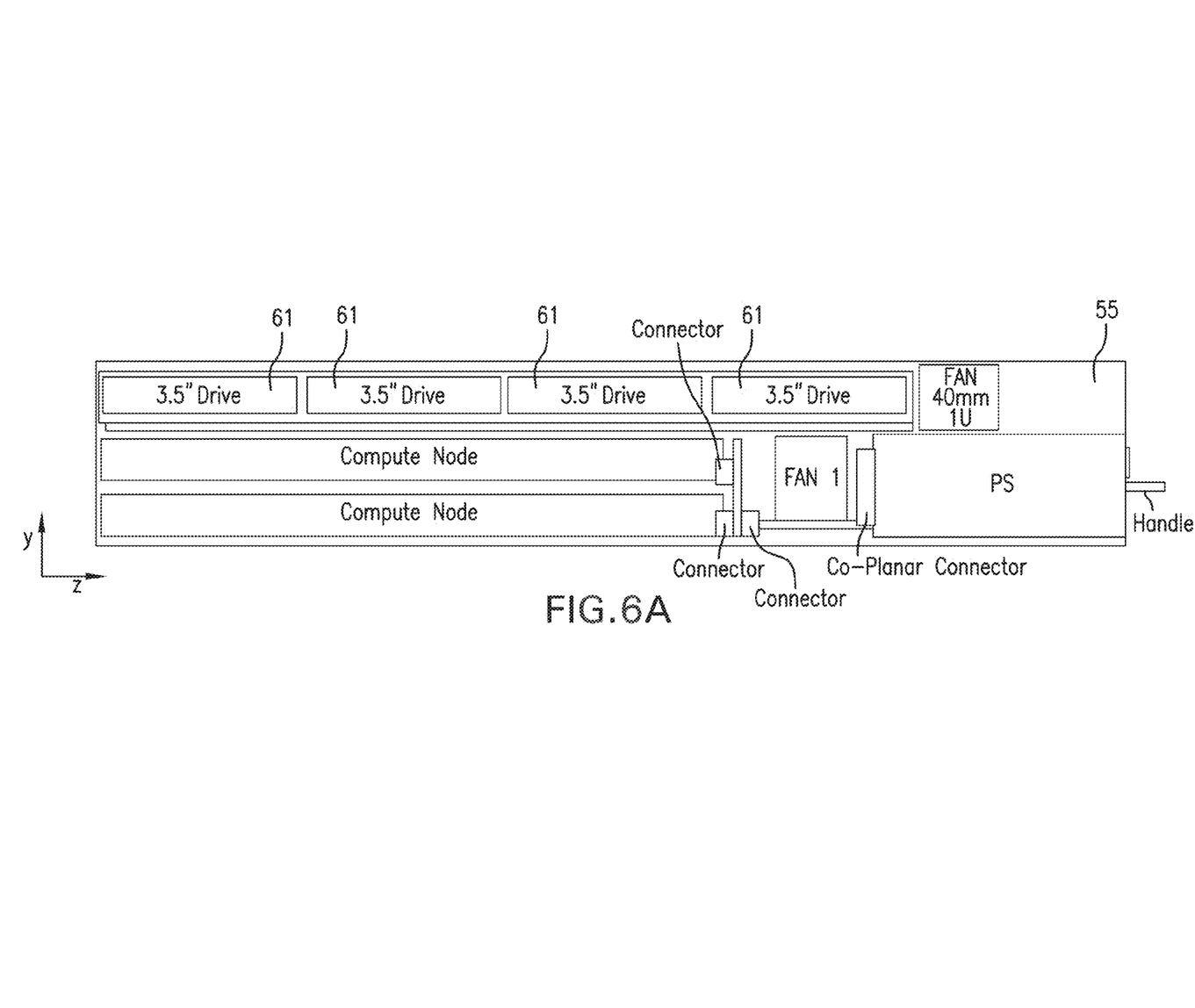
FIGS. 6A and 6B, collectively referred to herein as FIG. 6, is a schematic diagram of an exemplary rack unit for a 3U configuration.
Figure 6B:
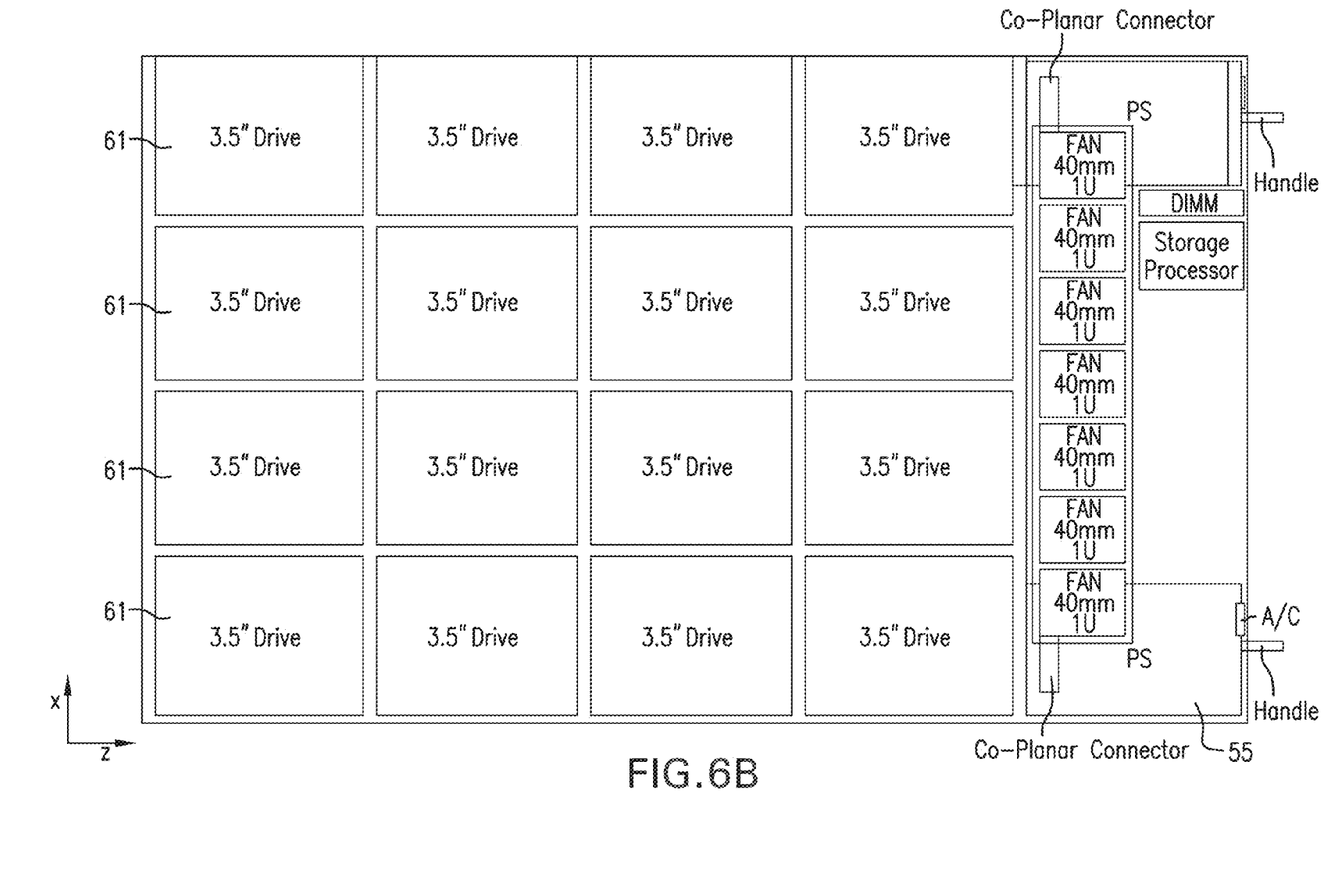

Referring now to FIG. 6, it may be seen that a 3U rack unit 55 configured according to the teachings herein permits incorporation of four conventional 3.5 inch hard drives to be disposed within the wide section of the rack unit 55. In contrast, only three conventional 3.5 inch hard drives could be disposed within the usable width, $W_U$, of the prior art rack unit 45.

That is, in some embodiments of the prior art rack unit 45, four (4) hot plug drives with front access were available. There were no drives behind these drives. Alternatively, four (4) drives across by X deep on a tray, but the drives were not hot-pluggable. In contrast, the rack unit 55 disclosed herein permits use of four (4) hot-pluggable drives across by X deep without a custom cable management scheme.

Figure 7A:
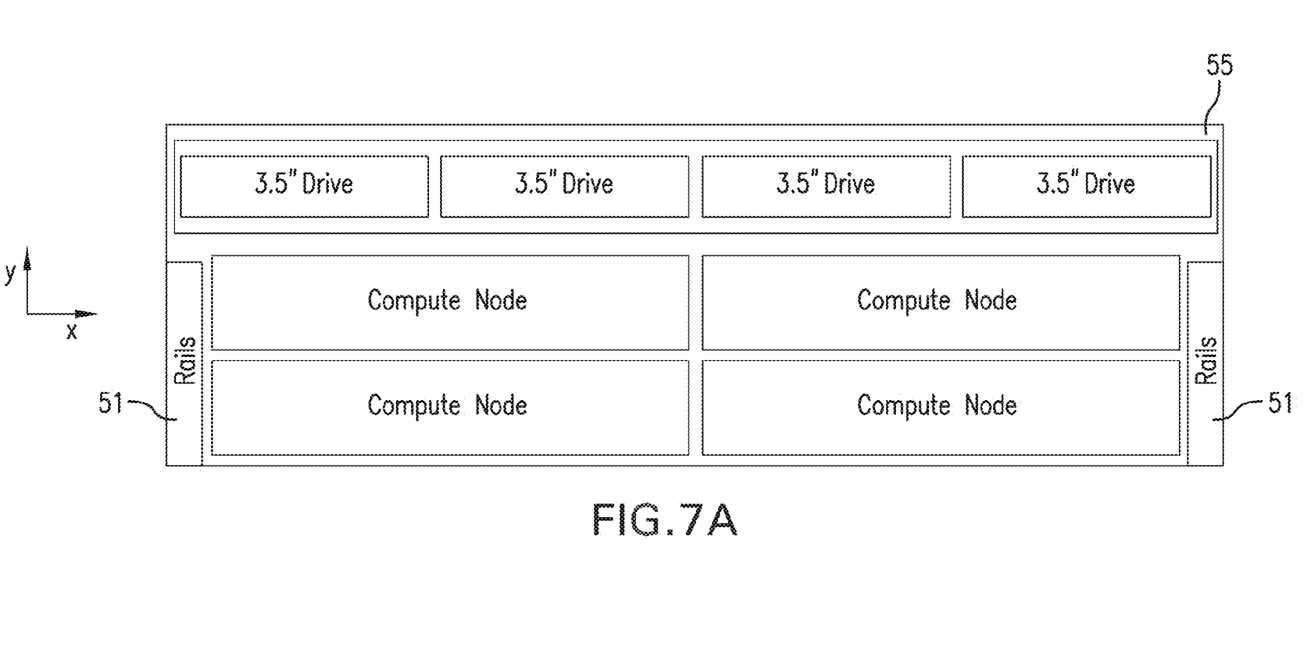
FIGS. 7A and 7B, collectively referred to herein as FIG. 7, is a schematic diagram of an exemplary rack unit for a 3U configuration; and, FIGS. 8A, 8B, 8C and 8D, collectively referred to herein as FIG. 8, are diagrams of exemplary drawer slides for use with the rack unit of FIGS. 5, 6 and 7.
Figure 7B:
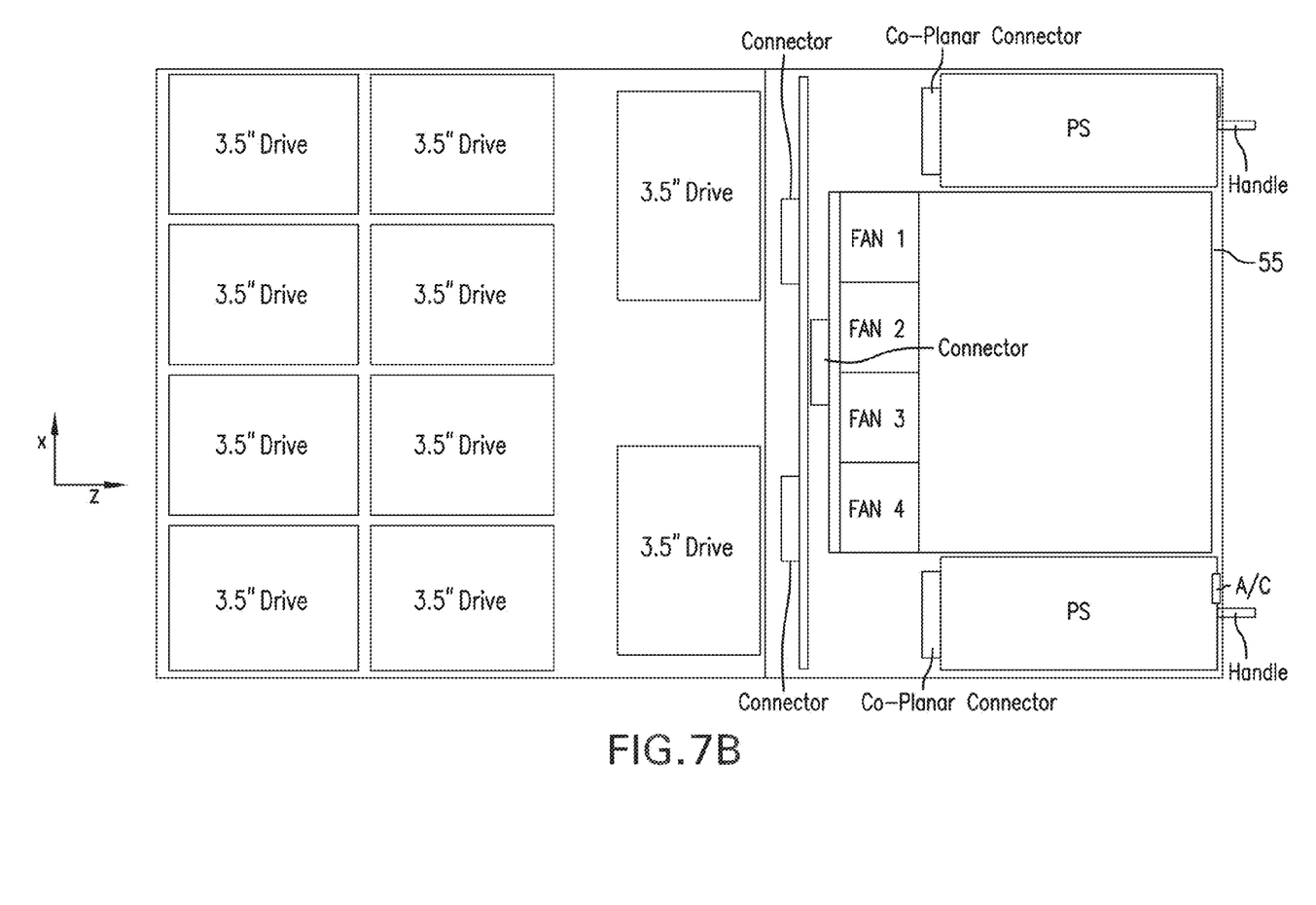

FIG. 7 depicts another embodiment of 3U rack unit 55. In particular, note that in FIG. 7A, a cross-section of the width of the rack unit 55 is shown. Accordingly, the T-shaped profile of the rack unit 55 may be seen in relation to the drawer slides 51.

Figure 8A:
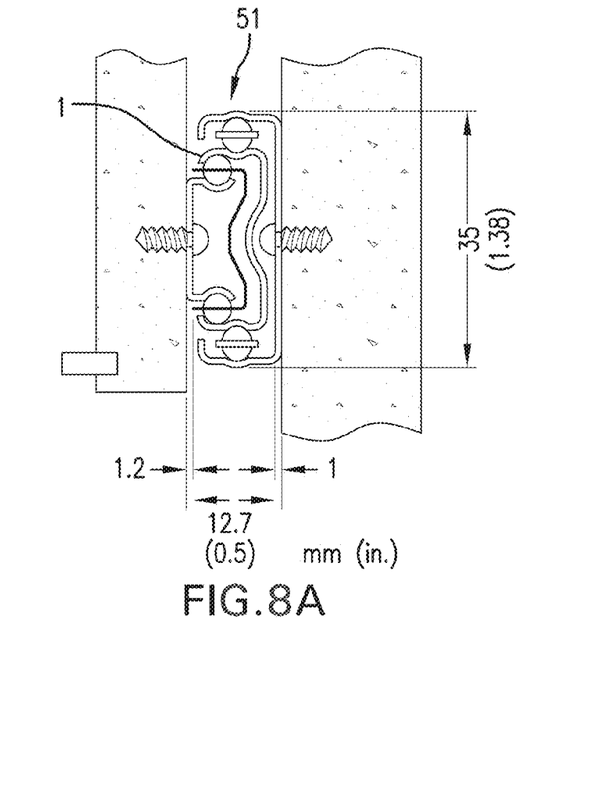
Figure 8B:
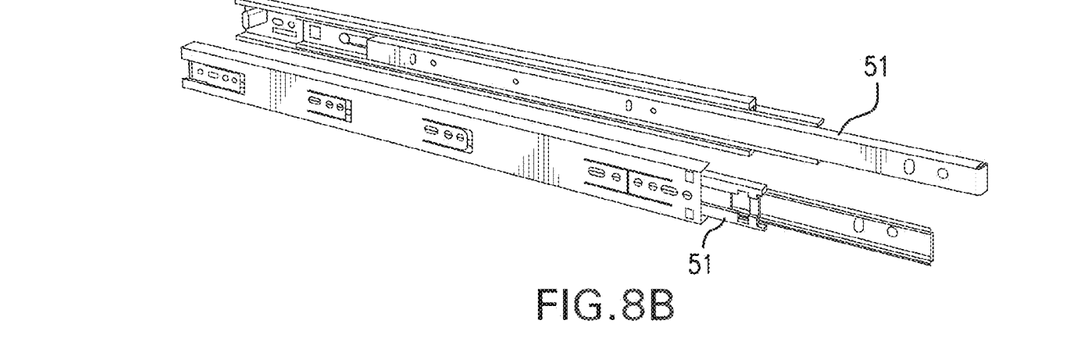

Each of the drawer slides 51 may be of a conventional design. For example, the drawer slide 51 may be a "regular-extension" drawer slide. The regular-extension drawer slide may also be referred to as partial extension drawer slide, and may include anyone of a variety of designs, such as those that incorporate roller bearing slides or ball bearing slides. In exemplary embodiments, a regular-extension drawer slide has a weight capacity in the range of between about 50 lbs. to 500 lbs. (see FIGS. 8A and 8B, showing cross-sectional and isometric diagrams, respectively).

Figure 8C:
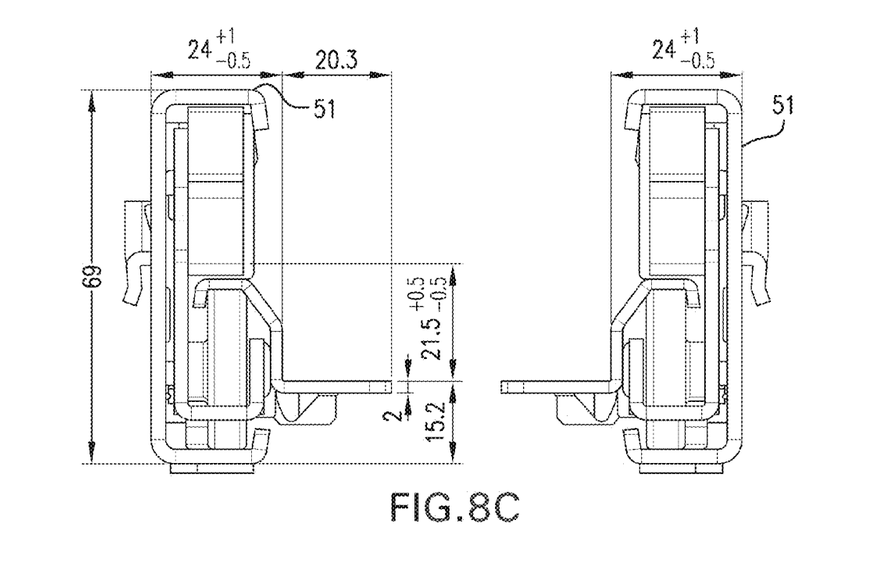
Figure 8D:
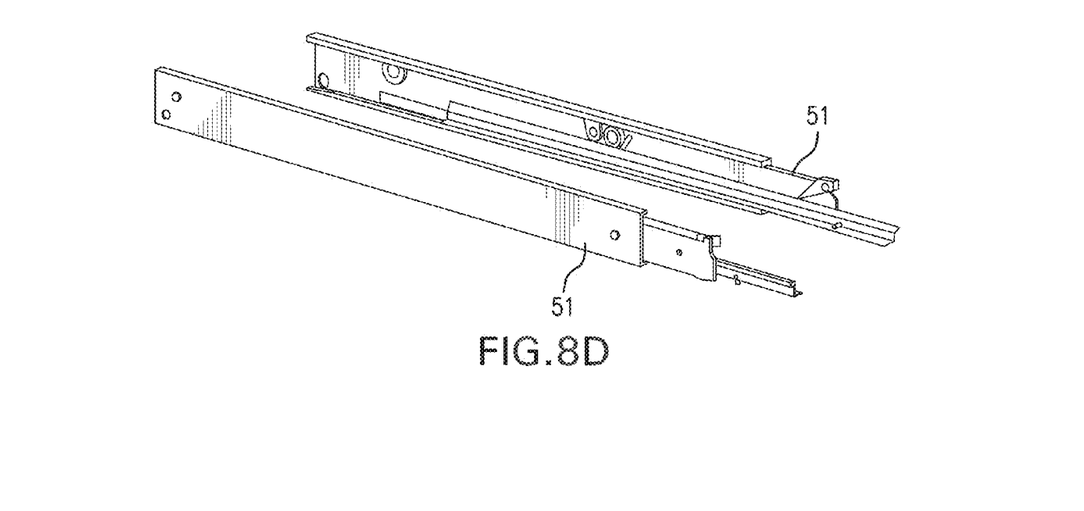

In another embodiment, the drawer slide 51 is a "full-extension" drawer slide. Common full-extension drawer slides usually extend at least one full length. In some embodiments, a full-extension drawer slide extends somewhat further than the full-length, and may be referred to as having "over-travel." The full-extension drawer slide may include a telescoping, full-extension, ball bearing design. (see FIGS. 8C and 8D, showing cross-sectional and isometric diagrams, respectively).

In some embodiments, the drawer slide 51 is referred to as the "progressive" drawer slide. The progressive drawer slide may provide for full and over-extension with smoother progressive rolling action and be tolerance friendlier with a high lateral stability. Progressive action slides overall have better attributes than the two-step telescoping full-extension, ball bearing slides. (Note that aspects of progressive action are shown in the design of FIGS. 8C and 8D).

Each of the drawer slides 51 may incorporate other features as appropriate. For example, each of the drawer slides 51 may be made of a high-strength material such as steel, or stainless steel. Each of the drawer slide 51 may include other design features such as an anti-tilt device (not shown). Exemplary and non-limiting embodiments of drawer slides 51 are available from Fulterer USA, Inc. of High Point, N.C. A variety of other manufacturers, both domestic and foreign, produce components that may be used for the drawer slide 51.

Having thus described aspects of the T-shaped rack unit, some additional embodiments and features are now introduced.

In various embodiments, system designers may take advantage of the extra space provided in the wide section of the rack unit and incorporate cabling, connection systems, and other components as appropriate to maximize use of space within the chassis.

In some embodiments, the drawer slides 51 are disposed on the inner walls of the storage rack, and the rails 5 are disposed on the chassis of the rack unit 55.

As discussed herein, the term "rack unit" encompasses a chassis which provides a body for incorporation, assembly and configuration of the computer components. Once the computer components have been assembled, the rack unit and the computer components may be referred to as a "server." Generally, the body is a housing that is fabricated from suitable materials such as metal. The chassis may be finished with paint, nonconductive materials, and is otherwise deemed appropriate. Generally, the chassis includes mounts for mounting the various computer components. The mounts for mounting the various computer components may include intermediate devices (not shown) such as printed circuit boards (PCB), cables, connectors, and other such devices. Further, the rack unit may include external connections for connecting to the storage rack and/or other components. The rack unit may include a removable top (not shown). The removable top generally provides users with access to the computer components within the rack unit. In some embodiments, the rack unit may include a removable bottom (not shown). The removable bottom generally provides users with access to components within the rack unit. In some embodiments, the rack unit includes a removable top and a removable bottom. The removable top and the removable bottom may be configured with conventional components.

As discussed herein, the term "low-profile," when used with reference to the combination of the drawer slide and the rail, and in relation to the rack unit, generally refers to a mechanical mounting system that uses only a portion of the height of the respective rack unit, and therefore provides for a wide section ($W_{U+2R}$) within the respective rack unit. The term "low-profile" when used with relation to the drawer slide alone, generally refers to a drawer slide that has a reduced width, W, when compared to conventional embodiments of drawer slides.

As discussed herein, a "set" of drawer slides generally refers to drawer slides that are mounted to the rack unit mounted on each side of the rack unit. Again, in some embodiments, the drawer slides may actually be mounted to the storage rack, and the rails disposed on the rack unit. In either case, or in other embodiments, the set of drawer slides refers to an arrangement of drawer slides that provides users with capability for storage of the rack unit within the storage rack, and subsequent access to contents of the rack unit as needed.

In some embodiments, the chassis 52 includes at least one wide section. For example, in the exemplary case of a 5U rack unit, the set of drawer slides may be disposed in the middle of the sides of the rack unit. Accordingly, the 5U rack unit may include a wide section below the set of drawer slides 51, and another wide section above the set of drawer slides 51. In this example, the chassis 52 includes an I-shaped cross-section. (See FIG. 5B).

In some embodiments, the T-shaped cross-section is inverted. That is, the rack unit may be considered as being suspended from the low-profile set of drawer slides.

The drawer slides may include other components is deemed appropriate. For example, the drawer slide may include ball bearings, roller bearings, soft closing mechanisms, easy close devices and other such components as are known in the art of drawer slides. Generally, the drawer slides are affixed to one of the chassis or the storage rack using techniques as are known in the art. In some embodiments, the drawer slides are affixed to the chassis or the storage rack by one of welding, gluing or by another similar technique that results in a low-profile drawer slide.

Various other components may be included and called upon for providing for aspects of the teachings herein. For example, additional materials, combinations of materials and/or omission of materials may be used to provide for added embodiments that are within the scope of the teachings herein.

A variety of modifications of the teachings herein may be realized. Generally, modifications may be designed according to the needs of a user, designer, manufacturer or other similarly interested party. The modifications may be intended to meet a particular standard of performance considered important by that party.

When introducing elements of the present invention or the embodiment(s) thereof, the articles "a," "an," and "the" are intended to mean that there are one or more of the elements. Similarly, the adjective "another," when used to introduce an element, is intended to mean one or more elements. The terms "including" and "having" are intended to be inclusive such that there may be additional elements other than the listed elements.

While the invention has been described with reference to exemplary embodiments, it will be understood by those skilled in the art that various changes may be made and equivalents may be substituted for elements thereof without departing from the scope of the invention. In addition, many modifications will be appreciated by those skilled in the art to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A rack unit for providing a server to be mounted within a storage rack, the rack unit comprising: a chassis comprising a set of low-profile drawer slides mounted thereto, the drawer slides configured for mounting the rack unit within the storage rack, the set of low-profile drawer slides configured for mounting upon rails of the storage rack; wherein, opposing sides of the chassis comprise at least two dimensions of separation ($W_U$, $W_{U+2R}$) therebetween, one of the dimensions of separation ($W_{U+2R}$) providing a wide section of the chassis, the other of the dimensions of separation ($W_U$) providing a narrow section of the chassis, and the wide section and the narrow section form a T-shaped; and wherein the wide section is configured to receive four 3.5 inch hard drives in a side-by-side configuration, and a combined width of the rails and the narrow section is equal to the wide section; and wherein the rack unit comprises dimensions for one of a 1U, 2U, 3U, 4U, 5U, 6U and 7U rack unit.

2. The rack unit as in claim 1, wherein the set of low-profile drawer slides is mounted upon the chassis and the rails are mounted within the storage rack.

3. The rack unit as in claim 1, wherein the set of low-profile drawer slides is mounted upon the chassis and the rails are mounted within the storage rack.

4. The rack unit as in claim 1, wherein the rack unit comprises dimensions for a multiple of U.

5. The rack unit as in claim 1, wherein the storage rack is one of 19 inches wide and 23 inches wide.

6. The rack unit as in claim 1, wherein the storage rack is compliant with at least one of Electronic Industries Alliance standard EIA-310-D, "Cabinets, Racks, Panels, and Associated Equipment"; Consumer Electronics Association CEA-310-E "Design Requirements for Cabinets, Panels, Racks and Subracks"; and International Electrotechnical Commission, standard IEC 60297 "Mechanical structures for electronic equipment—Dimensions of mechanical structures of the 482.6 mm (19 inch) series".

7. The rack unit as in claim 1, wherein the set of low-profile drawer slides comprises at least one of a regular-extension drawer slide, a full-extension drawer slide, an over-travel drawer slide, and a telescoping drawer slide.

8. The rack unit as in claim 1, wherein the chassis comprises one of a T-shaped cross-section, an I-shaped cross-section and an inverted T-shaped cross-section.

9. The rack unit as in claim 1, wherein the drawer slide comprises at least one of a ball bearing, a roller bearing, a soft closing mechanism and an easy close device.

10. The rack unit as in claim 1, wherein the at least one wide section provides for containing a plurality of hard drives, each hard drive being hot-pluggable.

11. A server comprising: a rack unit comprising a chassis with a set of low-profile drawer slides mounted thereto, the drawer slides configured for mounting the rack unit within a storage rack, the set of low-profile drawer slides configured for mounting upon rails of the storage rack;

a plurality of computer components configured within the chassis of the rack unit; wherein, opposing sides of the chassis comprise at least two dimensions of separation ($W_U$, $W_{U+2R}$) therebetween, one of the dimensions of separation ($W_{U+2R}$) providing a wide section of the chassis, the other of the dimensions of separation ($W_U$) providing a narrow section of the chassis, and the wide section and the narrow section form a T-shaped; wherein the wide section is configured to receive four 3.5 inch hard drives in a side-by-side configuration, and a combined width of the rails and the narrow section is equal to the wide section; and wherein the rack unit comprises dimensions for one of a 1U, 2U, 3U, 4U, 5U, 6U and 7U rack unit.

12. The server as in claim 11, wherein the computer components comprise at least one of a processor, memory, storage, a power supply, cooling, interface equipment, a switch, a bridge and a node.

13. The server as in claim 11, wherein the at least one wide section is configured for retaining four 3.5 inch hard drives in a side-by-side configuration.

14. A storage rack for computer equipment, the storage rack comprising:

at least one server disposed therein, the server comprising a plurality of computer components configured within a rack unit, the rack unit comprising a chassis with a set of low-profile drawer slides mounted thereto, the drawer slides configured for mounting the rack unit within a storage rack, the set of low-profile drawer slides configured for mounting upon rails of the storage rack; wherein, opposing sides of the chassis comprise at least two dimensions of separation ($W_U$, $W_{U+2R}$) therebetween, one of the dimensions of separation ($W_{U+2R}$) providing a wide section of the chassis, the other of the dimensions of separation ($W_U$) providing a narrow section of the chassis, and the wide section and the narrow section form a T-shaped; wherein the wide section is configured to receive four 3.5 inch hard drives in a side-by-side configuration, and a combined width of the rails and the narrow section is equal to the wide section; and wherein the rack unit comprises dimensions for one of a 1U, 2U, 3U, 4U, 5U, 6U and 7U rack unit.

15. The storage rack as in claim 14, further comprising at least one of a power supply and a cooling unit.

16. The storage rack as in claim 14, wherein the storage rack is compliant with at least one of Electronic Industries Alliance standard EIA-310-D, "Cabinets, Racks, Panels, and Associated Equipment"; Consumer Electronics Association CEA-310-E "Design Requirements for Cabinets, Panels, Racks and Subracks"; and International Electrotechnical Commission, standard IEC 60297 "Mechanical structures for electronic equipment—Dimensions of mechanical structures of the 482.6 mm (19 inch) series".

17. The storage rack as in claim 14, wherein the storage rack is one of 19 inches wide and 23 inches wide.

* * * * *